Sept. 28, 1965 J. B. McCARTHY CLIFTON 3,209,275
CIRCUIT FOR VARYING THE DRIVE OF AN AMPLIFIER IN ACCORDANCE WITH POWER OUTPUT DEMAND
Original Filed Aug. 7, 1958
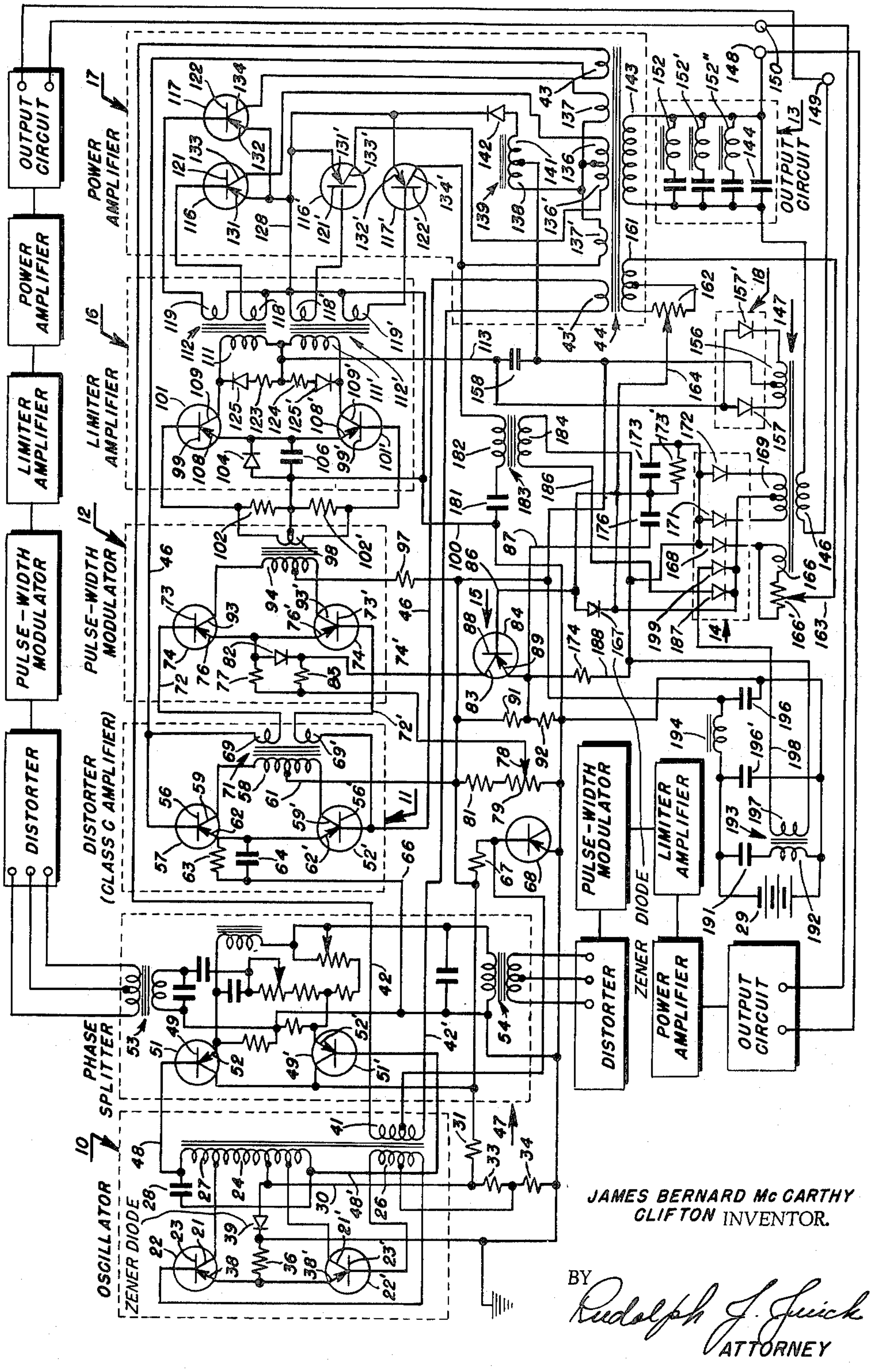
JAMES BERNARD Mc CARTHY CLIFTON INVENTOR.
BY Rudolph J. Juick
ATTORNEY 3,209,275

CIRCUIT FOR VARYING THE DRIVE OF AN AMPLIFIER IN ACCORDANCE WITH POWER OUTPUT DEMAND

James Bernard McCarthy Clifton, Wanamassa, N.J., assignor to The Bendix Corporation, Eatontown, N.J., a corporation of Delaware Original application Aug. 7, 1958, Ser. No. 753,737, now Patent No. 3,125,726, dated Mar. 17, 1964. Divided and this application May 2, 1962, Ser. No. 191,964
Claims priority, application Great Britain, Oct. 17, 1957, 32,430/57
2 Claims. (Cl. 330—22)

This invention relates to a power amplifier and more particularly to a transistor power amplifier and associated circuit elements to increase the drive to the amplifier when the power output demand therefrom increases.

This application is a division of my co-pending United States application Serial Number 753,737, filed August 7, 1958, now Patent Number 3,125,726, and entitled, "Apparatus for Converting D.-C. Power to A.-C. Power." Such prior-filed application discloses a power inverter which comprises, essentially, an oscillator having a substantially sine wave output together with circuit means including a pulse width modulator and a limiter amplifier, for the production of symmetrical positive and negative pulses of the same repetition frequency as the oscillator. These pulses, which are closely controlled in width and which are separated by intervals (or dwell periods of substantially zero level) are applied to a power amplifier from which the useful alternating current output is obtained. The present invention is directed particularly to the power amplifier having associated therewith novel circuit means for automatically increasing the drive to amplifier in correspondence with an increase in the power output demand.

An object of this invention is the provision of a power amplifier circuit including means effective to increase the drive of the amplifier when the power output demand therefrom increases.

An object of this invention is the provision of an arrangement for supplying a variable driving voltage to a power amplifier working in a switching mode in accordance with the required power output therefrom, which arrangement comprises a transformer having a primary winding in series with the amplifier output circuit and a secondary winding connected to a rectifier-filter system for the production of a D.-C. control voltage, said D.-C. control voltage being added to the D.-C. supply voltage of an amplifier driving the power amplifier, thereby to increase the drive of the power amplifier in correspondence with the increase power output demand.

These and other objects and advantages will become apparent from the following description when taken with the accompanying drawing. It will be understood, however, that the drawing is for purposes of illustration and is not to be construed as defining the scope or limits of the invention, reference being had for the latter purpose to the claims appended hereto.

It is here pointed out that the drawing, to which reference now is made, is a schematic circuit diagram of a power inverter identified as FIGURE 2 in the patent application above referred to. The drawing shows a three-phase inverter which comprises three single phase inverters operating at the same frequency but at a phase displacement of 120 degrees each from the other. Two phases of the apparatus are shown in block diagram form since they have identical counterparts in the one phase system which is shown in detail.

Briefly, the apparatus comprises an oscillator 10 providing a sine wave output of, say, 400 cycles per second. One output of the oscillator feeds a distorter 11, which distorter may be a Class C amplifier. Another output from the oscillator is applied to a pulse width modulator 12, together with the output from the distorter, which modulator may be operated in an over-biased Class B mode by the application of a controlled backward D.-C. bias on the transistors; the source of such backward bias including a signal from the output circuit 13 of the apparatus. The signal from the distorter 11 adds to the sine wave signal of the oscillator to provide an input signal to the pulse width modulator which is of increased slope, or steepness, in the region of the positive and negative peaks thereof, as compared to sine wave input alone. The output from the pulse width modulator, therefore, comprises alternate positive and negative going pulses which are accurately and smoothly controlled in width by means of the D.-C. bias applied thereto from the inverter output circuit through the rectifier 14 and the D.C. amplifier 15. Such controlled pulses are applied to a multivibrator, or limiter amplifier, 16.

The output from the limiter amplifier 16 comprises separate positive and negative going, approximately square waves, each wave having a width equal to the width of the pulses applied to the input thereof from the pulse width modulator. Such square wave outputs from the limiter amplifier drive a power amplifier 17 which may comprise two parallel stages of push-pull amplifier arrangements operating in a switching mode.

In inverters, and the like, which include a power amplifier operating in a switching mode, such as the power amplifier 17, it is necessary to provide a predetermined minimum drive to the power amplifier stage for a given value of power output required therefrom, the minimum power amplifier input power requirements rising with increased output power taken therefrom. In many applications, the power output required from the inverter may vary from time to time, whereby maximum power output may be required at one time, and less than maximum at another time. Under such conditions, it is undesirable to supply full power to the power amplifier when less than full available power is required. An important feature of this invention includes an arrangement wherein D.-C. supply voltage for the limiter amplifier 16, which drives the power amplifier 17, is made to vary in accordance with the power output requirements of the inverter. To this end, there is obtained from the resonant output circuit 13, a control voltage which is proportional to the power output of the resonant output circuit. This variable control voltage is rectified by means of the rectifier 18 and added to the constant D.-C. supply potential to the limiter amplifier 16, namely, the battery 29.

The power amplifier 17 comprises two push-pull amplifier arrangements, the outputs of which are connected in parallel. Separate inputs for each of the power transistors 116, 116′ and 117, 117′ are obtained from separate transformer secondary windings designated 118, 118′, 119 and 119′, respectively, of the transformers 112 and 112′. Such inputs are applied to the respective transistor base electrodes 121, 121' and 122, 122'. The individual transistor emitters 131, 131' and 132, 132' are connected together and to the common junction of the transformer secondary windings 118, 118', 119 and 119' by the wire 128, said common junction being connected to ground by the lead 100. It will be understood, that during the relaxation period corresponding to the off conditions of the transformers 112 and 112', a reverse voltage, decaying exponentially, is available across the secondary windings of the transformers to provide a reverse bias for the amplifier transistors thereby to prevent a runaway of the power amplifier.

The transistor collectors 133, 133' and 134, 134' connect to the primary windings 136, 136' and 137, 137', respectively, of the power output transformer 44. The negative side of the battery 29 is connected to the collector electrodes of the transistors, of the power amplifier, through the respective primary windings of the transformer 44 and the winding 138 of an inductor 139. The secondary winding 143 of the power output transformer 44 is tuned to the fundamental output frequency of the inverter, namely, 400 cycles per second, by a capacitor 144 connected in parallel with the secondary winding.

The inverter output, from the output circuit 13, is connected through a primary winding 146, of a current transformer 147, to two of the three inverter output terminals 148, 149 and 150. The output from the other two phases of the three phase inverters are suitably connected to the inverter output terminals to provide a three phase output therefrom.

As stated hereinabove, it is undesirable to supply the power amplifier 17 with the maximum driving power available at times that the power output requirements of the inverter are less than maximum. It is desired, therefore, to vary the driving power to the power amplifier in accordance with the level of output power. To this end, I include the transformer 147 having the primary winding 146 in series with the inverter output, whereby the current through the winding 146 varies directly with the inverter output current. One center-tapped secondary winding 156 feeds the rectifier network 18, which includes a pair of diodes 157, 157'; the center tap of the secondary winding 156 being directly connected to the negative supply source 29. The output from the rectifier network 18 at the lead wire 113 includes the sum of the negative supply potential and rectified output from the transformer secondary winding 156. A filter capacitor 158 is connected between the lead wire 113 and the negative supply source 29. The combined potential at the lead wire 113 provides a D.-C. supply to the limiter amplifier transistors. Thus, the limiter amplifier output, and consequently the drive to the power amplifier 17, varies directly with the output current demands from the inverter.

In order to stabilize the output voltage available from the power amplifier 17, a tapped secondary winding 161 is provided on the power output transformer 44. Obviously, the voltage developed at the secondary winding 161 is proportional to the output voltage of the power amplifier. A potentiometer 162 is connected across a portion of the said secondary winding whereby an adjustable voltage proportional to the output voltage of the power amplifier is obtained across the lead wire 163 from one end of the secondary winding 161 and the movable arm 164 of the potentiometer. In prior art arrangements, this output voltage is rectified, filtered and used in some form of automatic gain control mechanism to control the drive to the power amplifier. Such prior art arrangements do not, however, provide adequate voltage control in systems wherein the power amplifier output current demands vary over a wide range. In accordance with my invention, therefore, an additional secondary winding 166 is provided on the current transformer 147, which winding is in series circuit connection with the winding 161 through a potentiometer 166' connected thereacross. The output from the winding 166 (which is proportional to the output current demands of the power amplifier) is added to the output from the secondary winding 161 (which is proportional to the voltage output of the power amplifier) and the combined voltage is fed to a Zener diode 167 and rectifier 168 of the rectifier network 14. The combined rectified output of the windings 161 and 166 is fed to a filter network which includes a shunt input capacitor 173, series resistor 174, and shunt output capacitor 176. A load resistor 173' in shunt with the capacitor 173 provides a discharge path for the capacitor. With the Zener diode 167 connected in series with the combined rectified output from the windings 161 and 166, it will be understood that substantially no D.-C. voltage is fed to the filter network from the rectifier 168 until the said combined output reaches a predetermined value depending upon the Zener diode used. As soon as such predetermined value is reached, further increase in load voltage will produce a relatively rapid increase in the D.-C. output from the filter network, which filter output is connected to the leads 86 and 87, thereby providing an input to the D.-C. amplifier 15, which, in turn, sets the backward D.-C. bias on the pulse width modulator transistors. By including the current transformer secondary winding 166 in series with the potential winding 161, much greater accuracy of control of the output voltage from the power amplifier is possible under conditions of widely varying load current, than if only the voltage winding 161 alone is used, as in prior art devices.

In accordance with my invention, an additional secondary winding 169 may be provided on the current transformer 147. The ouput from this winding is rectified by rectifiers 171 and 172 in the rectifier network 14, and connected in parallel to the rectified output from the series connected secondary windings 161 and 166. The rectified output from the winding 169, therefore, is connected to the transistor 84 in the D.-C. amplifier 15 through the Zener diode 167 and filter network, as is the combined rectified output from the windings 161 and 166. Assuming that the output voltage is sufficiently low such that the combined voltage of the windings 161 and 166 is below the Zener voltage of the diode 167, substantially no voltage is supplied to the filter network of the resistors 173' and 174 and capacitors 173 and 176 until the output load current rises sufficiently towards a predetermined dangerous value. Further increase in load current will produce a sufficient voltage at the secondary winding 169 to cause the Zener diode 167 to conduct. As before, upon conduction of the Zener diode, the voltage across the filter network increases rapidly whereupon the automatic gain control circuitry functions to increase the backward D.-C. bias on the pulse width modulator circuit 12. The width of the output pulses from the pulse width modulator, and consequently the drive to the power amplifier is reduced thereby preventing the latter from being damaged by excessive output load currents.

Having now described my invention, what I desire to protect by Letters Patent is set forth in the following claims.

I claim:

1. Electronic apparatus comprising, a driving amplifier having input and output circuits; means applying an A.C. input signal of predetermined level to the driving amplifier input circuit; a D.C. supply potential applied to the driving amplifier; a power amplifier having an input circuit connected to the output circuit of the driving amplifier and an output circuit; an output transformer having a primary winding connected in the power amplifier output circuit, a first secondary winding connected to the apparatus output terminals and a second secondary winding; a current transformer having a primary winding connected in series with the said first secondary winding of the output transformer, a first secondary winding and a second secondary winding; a first rectifier network connected across the said first secondary winding of the current transformer; circuit elements for adding the D.C. output voltage of the first rectifier network to the said D.C. supply potential; a second rectifier network; circuit elements applying to the second rectifier network the combined voltages developed in the second secondary windings of the output and current transformers; and means reducing the level of the said A.C. input signal when the D.C. output voltage of the second rectifier network exceeds a predetermined value.

2. The invention as recited in claim 1, including a third secondary winding on the current transformer, a third rectifier network connected to the said third secondary winding, and means reducing the level of the said A.C. input signal when the D.C. output voltage of the third rectifier network exceeds a predetermined value.

References Cited by the Examiner

UNITED STATES PATENTS

| | | | |
|---|---|---|---|
| 2,222,173 | 11/40 | Fritzinger | 330—96 X |
| 3,015,075 | 12/61 | Bargellini | 330—15 |

OTHER REFERENCES

Rideout, V. C.: Active Networks, N.J., Prentice-Hall 1954, pages 175 and 182.

ROY LAKE, *Primary Examiner.*

NATHAN KAUFMAN, *Examiner.*